United States Patent
Chien et al.

(10) Patent No.: US 10,141,193 B2
(45) Date of Patent: Nov. 27, 2018

(54) FABRICATING METHOD OF A SEMICONDUCTOR DEVICE WITH A HIGH-K DIELECTRIC LAYER HAVING A U-SHAPE PROFILE

(71) Applicant: UNITED MICROELECTRONICS CORP., Hsin-Chu (TW)

(72) Inventors: Chin-Cheng Chien, Tainan (TW); Chun-Yuan Wu, Yun-Lin County (TW); Chih-Chien Liu, Taipei (TW); Chin-Fu Lin, Tainan (TW); Teng-Chun Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 184 days.

(21) Appl. No.: 14/949,896

(22) Filed: Nov. 24, 2015

(65) Prior Publication Data
US 2016/0079067 A1 Mar. 17, 2016

Related U.S. Application Data

(62) Division of application No. 13/161,503, filed on Jun. 16, 2011, now abandoned.

(51) Int. Cl.
| H01L 21/28 | (2006.01) |
| H01L 29/423 | (2006.01) |
| H01L 29/49 | (2006.01) |
| H01L 29/51 | (2006.01) |
| H01L 29/66 | (2006.01) |

(52) U.S. Cl.
CPC .. *H01L 21/28158* (2013.01); *H01L 21/28114* (2013.01); *H01L 21/28185* (2013.01); *H01L 29/42368* (2013.01); *H01L 29/42372* (2013.01); *H01L 29/42376* (2013.01); *H01L 29/49* (2013.01); *H01L 29/4966* (2013.01); *H01L 29/4983* (2013.01); *H01L 29/51* (2013.01); *H01L 29/517* (2013.01); *H01L 29/66545* (2013.01)

(58) Field of Classification Search
CPC ......... H01L 21/28114; H01L 21/28185; H01L 29/42372; H01L 29/4966; H01L 29/4983; H01L 29/517; H01L 29/66545; H01L 29/49; H01L 29/51; H01L 21/28158
USPC ........................................ 438/591, 592, 596
See application file for complete search history.

(56) References Cited

U.S. PATENT DOCUMENTS

| 5,892,282 | A | 4/1999 | Hong |
| 6,042,975 | A * | 3/2000 | Burm ............... G03F 9/708 257/E21.027 |
| 6,096,659 | A | 8/2000 | Gardner |
| 6,177,303 | B1 | 1/2001 | Schmitz |
| 6,303,418 | B1 | 10/2001 | Cha |
| 6,458,684 | B1 | 10/2002 | Guo |
| 6,573,134 | B2 | 6/2003 | Ma |
| 6,956,263 | B1 | 10/2005 | Mistry |
| 6,960,416 | B2 | 11/2005 | Mui |
| 7,126,199 | B2 | 10/2006 | Doczy |
| 7,144,783 | B2 | 12/2006 | Datta |

(Continued)

*Primary Examiner* — Marcos D Pizarro
(74) *Attorney, Agent, or Firm* — Winston Hsu

(57) ABSTRACT

A semiconductor device including a substrate, a spacer and a high-k dielectric layer having a U-shape profile is provided. The spacer located on the substrate surrounds and defines a trench. The high-k dielectric layer having a U-shape profile is located in the trench, and the high-k dielectric layer having a U-shape profile exposes an upper portion of the sidewalls of the trench.

5 Claims, 7 Drawing Sheets

(56) References Cited

U.S. PATENT DOCUMENTS

| | | |
|---|---|---|
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |
| 7,407,876 B2 | 8/2008 | Ishizaka |
| 7,556,998 B2 | 7/2009 | Park |
| 7,700,479 B2 | 4/2010 | Huang |
| 7,745,889 B2 | 6/2010 | Lin |
| 2005/0224886 A1 | 10/2005 | Doyle |
| 2005/0245036 A1* | 11/2005 | Datta ............... H01L 21/28114 438/287 |
| 2006/0024953 A1 | 2/2006 | Papa Rao |
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0185637 A1* | 8/2008 | Nagaoka ........... H01L 29/66545 257/327 |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0078733 A1 | 4/2010 | Masuoka |
| 2010/0087055 A1 | 4/2010 | Lai |
| 2010/0124818 A1 | 5/2010 | Lee |
| 2010/0244141 A1 | 9/2010 | Beyer |

\* cited by examiner

FABRICATING METHOD OF A SEMICONDUCTOR DEVICE WITH A HIGH-K DIELECTRIC LAYER HAVING A U-SHAPE PROFILE

CROSS REFERENCE TO RELATED APPLICATIONS

This patent application is a divisional application of and claims priority to U.S. patent application Ser. No. 13/161,503, filed on Jun. 16, 2011, and entitled "SEMICONDUCTOR DEVICE AND FABRICATION METHOD THEREOF" the entire contents of which are incorporated herein by reference.

BACKGROUND OF THE INVENTION

1. Field of the Invention

The present invention relates generally to a semiconductor device and fabrication method thereof, and more specifically, to a fabricating method of etching a high-k dielectric layer having a U-shape profile and the semiconductor device fabricated thereby.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect, which increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

In a complementary metal-oxide semiconductor (CMOS) device, one of the dual work function metal gates is used in an NMOS device and the other one is alternatively used in a PMOS device. It is well known that compatibility and process control for the dual metal gate are more complicated, meanwhile thickness and composition controls for materials used in the dual metal gate method are more precise. The conventional dual metal gate methods are categorized into gate first processes and gate last processes. In a conventional dual metal gate method applied with the gate first process, the anneal process for forming the source/drain ultra-shallow junction, and the silicide process are performed after forming the metal gate. After performing the anneal process having such strict heat budget, it is found that a flat band voltage (Vfb) does not increase or decrease linearly with decreasing EOT of the high-K gate dielectric layer. Instead, a roll-off issue is observed. Therefore, the gate last process is developed to improve the Vfb roll-off issue and avoid generating leakage current due to re-crystallization of the high-K gate dielectric layer occurring in high-temperature processes, and to widen material choices for the high-K gate dielectric layer and the metal gate in the gate first process.

In the conventional gate last process, a sacrifice gate or a replacement gate is provided and followed by performing processes used to construct a normal MOS transistor. Then, the sacrifice/replacement gate is removed to form a trench. Consequently, the structure formed by a gate-last process (more specifically to being formed by a gate-last for high-k last process) would have a high-k dielectric layer having a U-shape profile 110, a work function metal layer having a U-shape profile 120, and further comprises a plurality of barrier layers 130 formed between each layer as shown in FIG. 1. These multiple layers having a U-shape profile would lead to a protruding structure 150 at the top portion of the trench 140, therefore reducing the opening of the trench 140. As the size of the semiconductor device shrinks, the sequential formed a filling metal layer (not shown), aluminum for example, will be difficult to be filled into the trench 140. Otherwise, the fringe capacitance of the semiconductor device 100 increases because of the high-k dielectric layer having a U-shape profile 110, therefore reducing the electrical performance of the semiconductor device.

SUMMARY OF THE INVENTION

The present invention provides a semiconductor device and fabrication method thereof to solve the said problems of the filling difficulty of the metal layer and the increasing fringe capacitance of the semiconductor device.

The present invention provides a semiconductor device including a substrate, an inter layer dielectric layer, a trench, and a high-k dielectric layer having a U-shape profile. The inter layer dielectric layer is located on the substrate. The trench is located in the inter layer dielectric layer. The high-k dielectric layer having a U-shape profile is located in the trench, wherein the high-k dielectric layer having a U-shape profile exposes an upper portion of the sidewalls of the trench.

The present invention provides a fabricating method of the semiconductor device comprising the following. An inter layer dielectric layer is formed on a substrate. A trench is formed in the inter layer dielectric layer. A high-k dielectric layer having a U-shape profile is formed in the trench. The high-k dielectric layer is recessed to expose an upper portion of the sidewalls of the trench.

The present invention provides a fabricating method of the semiconductor device comprising the following. An interface layer dielectric layer is formed on a substrate. A trench is formed in the inter layer dielectric layer. A high-k dielectric layer having a U-shape profile is formed in the trench. A work function metal layer having a U-shape profile is formed on the high-k dielectric layer having a U-shape profile. A filling material is filled into the trench. The filling material is etched back to expose the two ends of the work function metal layer and the two ends of the high-k dielectric layer. The two ends of the high-k dielectric layer are reduced to transform it to a metal layer. The two ends of the work function metal layer and the metal layer are removed. The filling material is removed.

According to the above, the present invention provides a semiconductor device and fabrication method thereof, which reduces a portion of the two ends of the U-shaped cross-sectional profile of the high-k dielectric layer having a U-shape profile to transform it to a metal layer by using a filling material as a mask, after the high-k dielectric layer having a U-shape profile is formed. Then, removing the metal layer by itself, or removing the metal layer and a portion of the two ends of the U-shaped cross-sectional profile of the work function metal layer formed on the high-k dielectric layer having a U-shape profile in one step. In this way, the filling difficulty about filling the sequential formed material layers, such as a barrier layer, a filling metal layer etc., into the trench would not happen because there are not too many material layers having a U-shape profile being deposited in the top portion of the gat recess. Besides, the semiconductor device fabricated by the methods of the present invention has a lower fringe capacitance because the methods of the present invention remove at least a portion of the two ends of a U-shape profile of the high-k dielectric layer having a U-shape profile.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
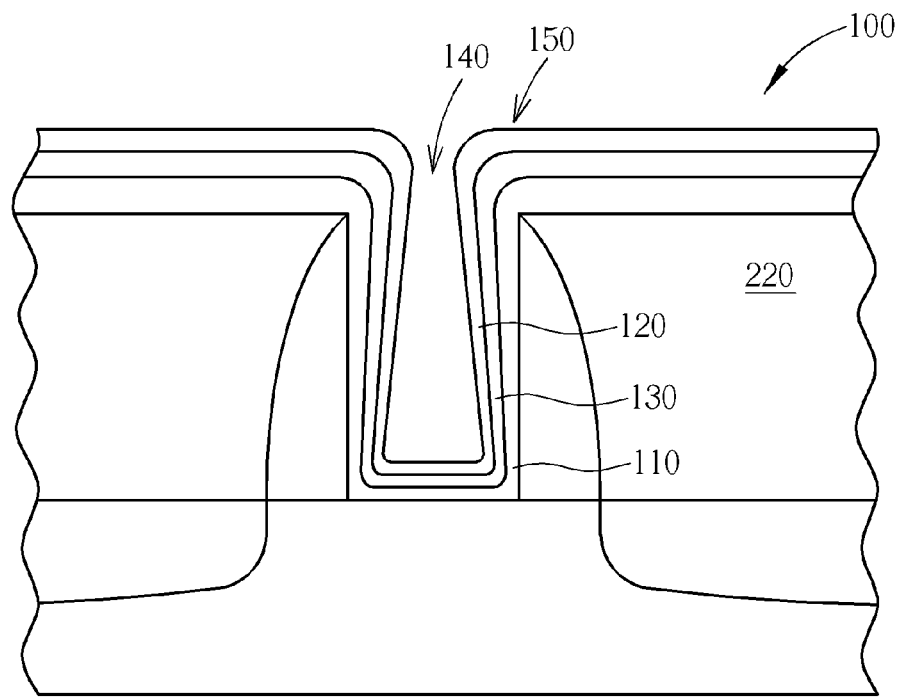
FIG. 1 schematically depicts a cross-sectional view of a conventional semiconductor device.
Figure 2:
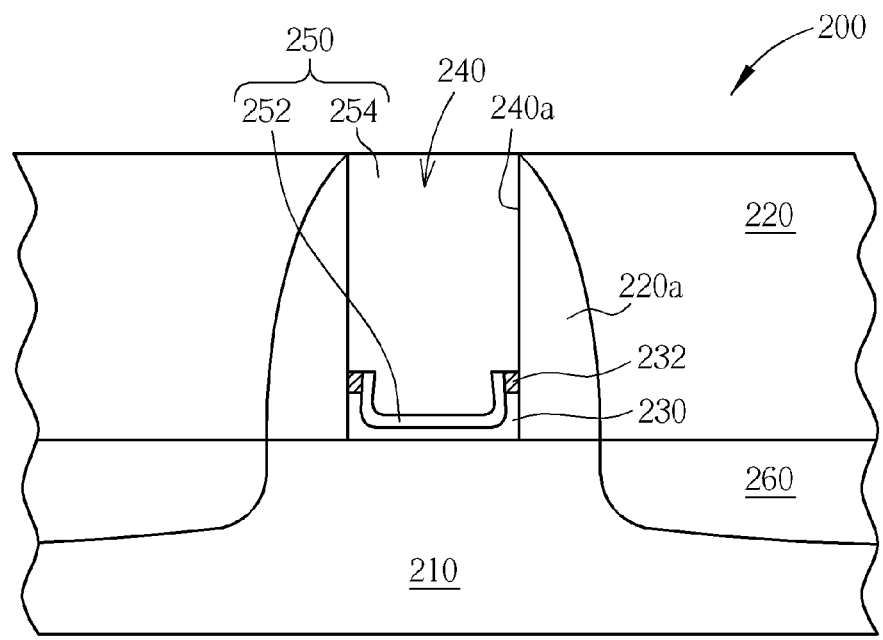
FIG. 2 schematically depicts a cross-sectional view of a semiconductor device according to one preferred embodiment of the present invention.

FIG. 2 schematically depicts a cross-sectional view of a semiconductor device according to one preferred embodiment of the present invention. As shown in FIG. 2, the semiconductor device 200 includes a substrate 210, an inter layer dielectric layer 220, a trench 240 and a high-k dielectric layer having a U-shape profile 230. An inter layer dielectric 220 is located on the substrate 210. The trench 240 is located in the inter layer dielectric layer 220. The high-k dielectric layer having a U-shape profile 230 is located within the trench 240 and exposes an upper portion 240a of the sidewalls of the trench 240. Moreover, the trench 240 may be formed by the method of the following. A gate structure (not shown) is formed on the substrate 210, wherein the gate structure includes a gate dielectric layer and a sacrificed gate located on the gate dielectric layer. The forming method of the gate structure is known in the art and so is not described herein. An inter layer dielectric 220, which may include a spacer 220a is formed beside the gate structure. An etching process is performed to remove the gate structure and form the trench 240.

The substrate 210 may be a semiconductor substrate such as a silicon substrate, a silicon containing substrate and a silicon-on-insulator (SOI) substrate. The spacer 220a may be a single layer or a multilayer structure composed of silicon nitride or silicon oxide. The high-k dielectric layer having a U-shape profile 230 may be a metal containing dielectric layer, such as hafnium oxide, zirconium oxide, but is not limited thereto. Furthermore, the high-k dielectric layer having a U-shape cross-sectional U-shape profile 230 may be a group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide, ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST).

In this embodiment, the high-k dielectric layer having a U-shape profile 230 is a metal containing dielectric layer and the high-k dielectric layer having a U-shape profile 230 includes a metal layer 232 located on the two ends of the U-shaped cross-sectional profile of the high-k dielectric layer having a U-shape profile 230, wherein the metal layer 232 is the reduction of the high-k dielectric layer having a U-shape profile 230. In other words, the high-k dielectric layer having a U-shape profile 230 is a chemical compound of the metal layer 232.

Furthermore, the semiconductor device 200 further includes a gate metal layer 250 located on the high-k dielectric layer having a U-shape profile 230, wherein the gate metal layer 250 includes a work function metal layer 252 and a filling metal layer 254 located on the work function metal layer 252. The work function metal layer 252 is also a U-shape profile structure located on the high-k dielectric layer having a U-shape profile 230. In a preferred embodiment, the two ends of the U-shaped cross-sectional profile of the work function metal layer 252 are trimmed with the two ends of the U-shaped cross-sectional profile of the high-k dielectric layer having a U-shape profile 230, but it is not limited thereto. In another embodiment, the height of the two ends of the U-shaped cross-sectional profile of the work function metal layer 252 is not restricted by the height of high-k dielectric layer having a U-shape profile 230. The work function metal layer 252 may be a titanium aluminum (TiAl) layer, a titanium nitride metal layer, or other material layers, which depends on the characteristic of the semiconductor device 200. For example, the work function metal layer 252 is a titanium aluminum (TiAl) metal layer while the semiconductor device 200 is a NMOS transistor; the work function metal layer 252 is a titanium nitride metal layer while the semiconductor device 200 is a PMOS transistor. The filling metal layer 254 may be composed by metals such as aluminum, but it is not limited thereto.

Otherwise, an interface layer (not shown) may be further included between the substrate 210 and the high-k dielectric layer having a U-shape profile 230, for being a buffer layer of the substrate 210 and the high-k dielectric layer having a U-shape profile 230. The interface layer may be composed of silicon dioxide, but it is not limited thereto. The semiconductor device 200 may further include a barrier layer (not shown) located on the high-k dielectric layer having a U-shape profile 230. For instance, a barrier layer (not shown) further comprised, is respectively formed between the high-k dielectric layer having a U-shape profile 230 and the work function metal layer 252 and between the work function metal layer 252 and the filling metal layer 254, to avoid pollution between each material layer caused by diffusion. In one case, the barrier layer (not shown) may be a titanium nitride metal layer, a tantalum nitride metal layer or a multi-layer structure composed of a titanium nitride metal layer and a tantalum nitride metal layer, but it is not limited thereto. Besides, a lightly doped source/drain region (not shown) or a source/drain region 260 may be automatically aligned and defined by using the spacer 220a as a mask.

Above of all, the high-k dielectric layer having a U-shape profile 230 and the work function metal layer 252 are U-shape profile structures. They expose the upper portion 240a of the sidewalls of the trench 240. Therefore, the semiconductor device 200 of the present invention has fewer material layers deposited on the top of the sidewalls of the trench 240, hence avoiding the problem of the protruding structure of the prior art, which leads to the filling difficulty about filling the material layers, such as the filling metal layer, into the trench 240. Besides, the high-k dielectric layer having a U-shape profile 230 of the present invention exposes the upper portion 240a of the sidewalls of the trench 240. Thereby, the semiconductor device 200 of the present invention has a smaller fringe capacitance so as to improve the performance of the semiconductor device 200.

Figure 3A:
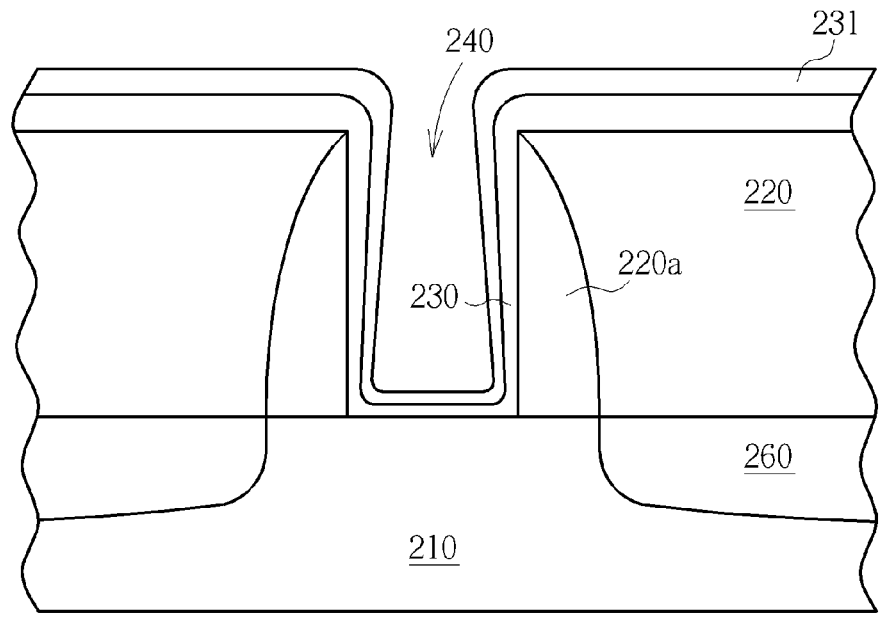
FIG. 3A schematically depicts a cross-sectional view of a fabricating method of the semiconductor device of FIG. 2.

FIG. 3A-3F schematically depict a cross-sectional view of a fabricating method of the semiconductor device of FIG. 2. As shown in FIG. 3A, a substrate 210 is provided. An inter layer dielectric layer 220, which may include a spacer 220a, is formed on the substrate 210. A trench 240 is formed in the inter layer dielectric layer 220. A high-k dielectric layer having a U-shape profile 230 is formed within the trench 240. A barrier layer 231 can be selectively formed on the high-k dielectric layer having a U-shape profile 230. The barrier layer 231 may include a titanium nitride metal layer, a tantalum nitride metal layer or a multi-layer structure composed of a titanium nitride metal layer and a tantalum nitride metal layer, to prevent the high-k dielectric layer having a U-shape profile 230 from being damaged in the following processes. In the following processes, the barrier layer 231 is omitted.

Figure 3B:
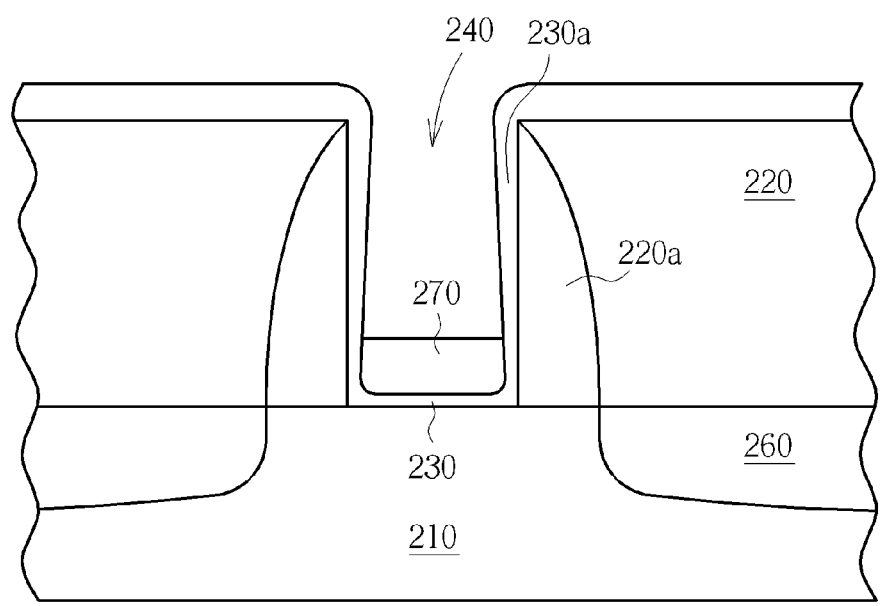
FIG. 3B schematically depicts a cross-sectional view of a fabricating method of the semiconductor device of FIG. 2.
Figure 3B:
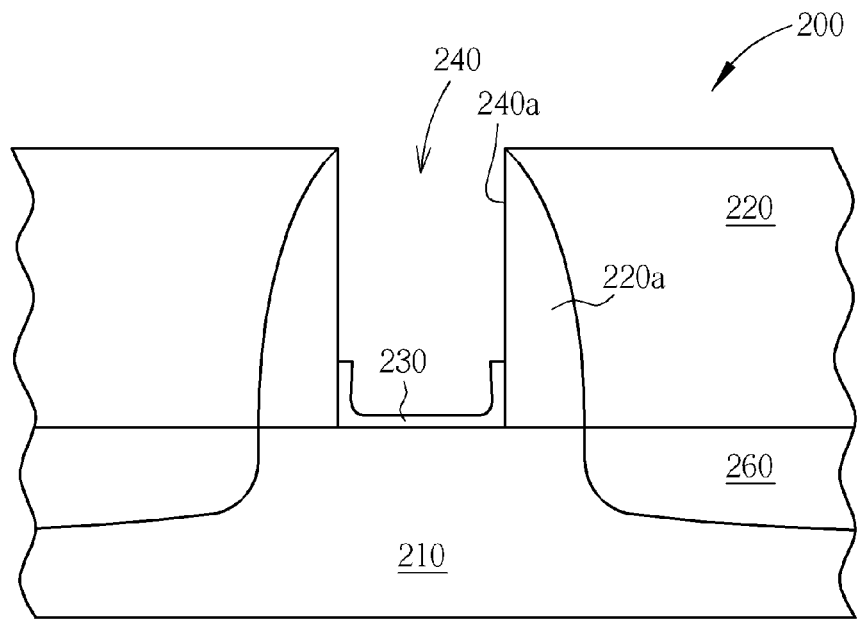

As shown in FIG. 3B, a filling material 270, such as a photoresist material, a bottom anti-reflection coating (BARC), organic dielectric layer (ODL) or a light absorbing Si-content polymer, (DUO), is filled into the trench 240. Then, the filling material 270 is etched back to expose the two ends of the U-shaped cross-sectional profile 230a of the high-k dielectric layer having a U-shape profile 230, wherein the filling material 270 may be etched back by dry etching method, wet etching method etc.

As shown in FIG. 3B', an etching process, such as a dry etching process or a wet etching process, is directly performed to remove the exposed two ends of the U-shaped cross-sectional profile 230a of the high-k dielectric layer having a U-shape profile 230.

Figure 3C:
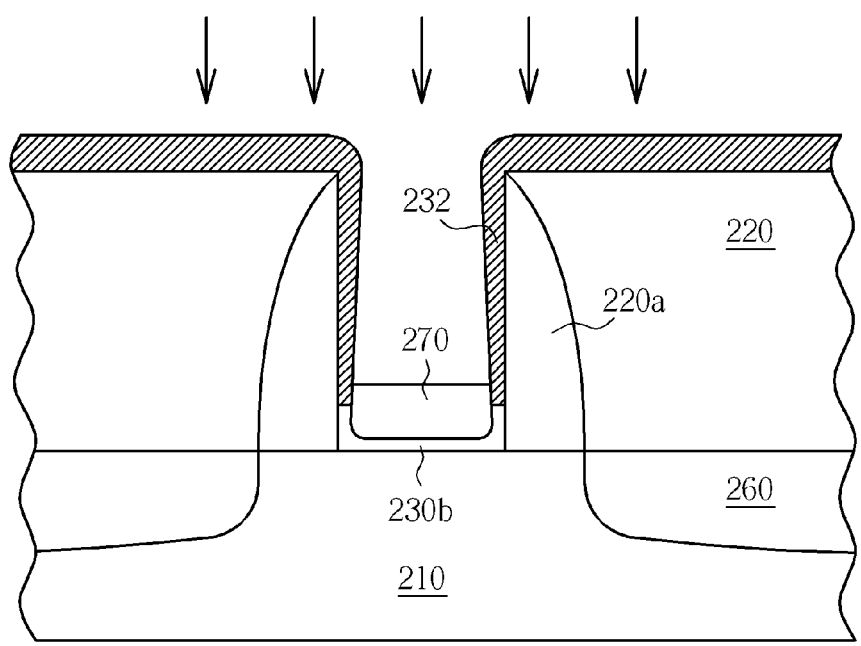
FIG. 3C schematically depicts a cross-sectional view of a fabricating method of the semiconductor device of FIG. 2.

Or, as shown in FIG. 3C, the exposed two ends of the U-shaped cross-sectional profile 230a are reduced to transform as a metal layer 232, wherein the reduction may include a hydrogen containing reducing process or a hydrogen plasma containing reducing process. The reduction elements can not penetrate through the filling material 270 to reduce the bottom 230b of the high-k dielectric layer having a U-shape profile.

Figure 3D:
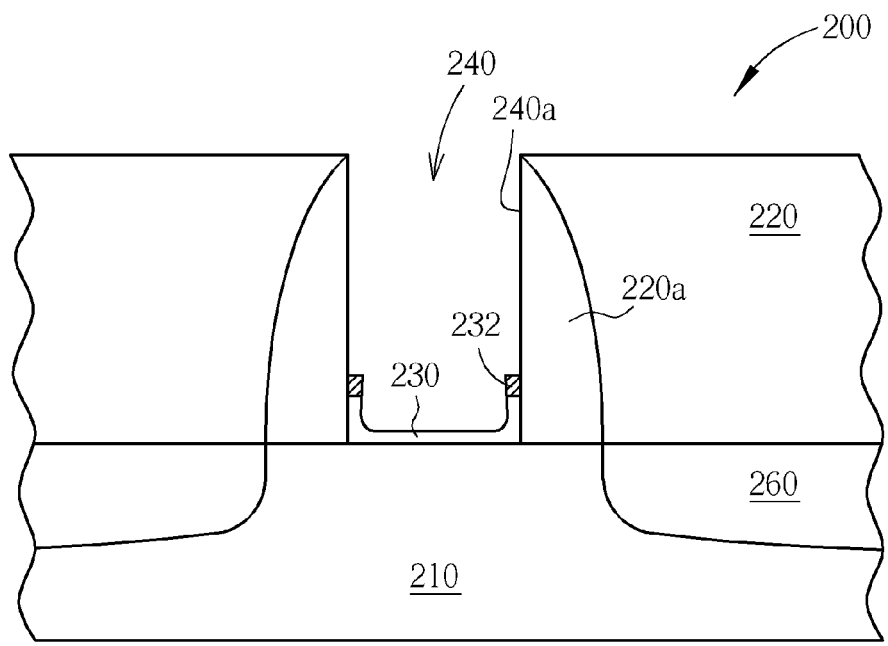
FIG. 3D schematically depicts a cross-sectional view of a fabricating method of the semiconductor device of FIG. 2.
Figure 3D:
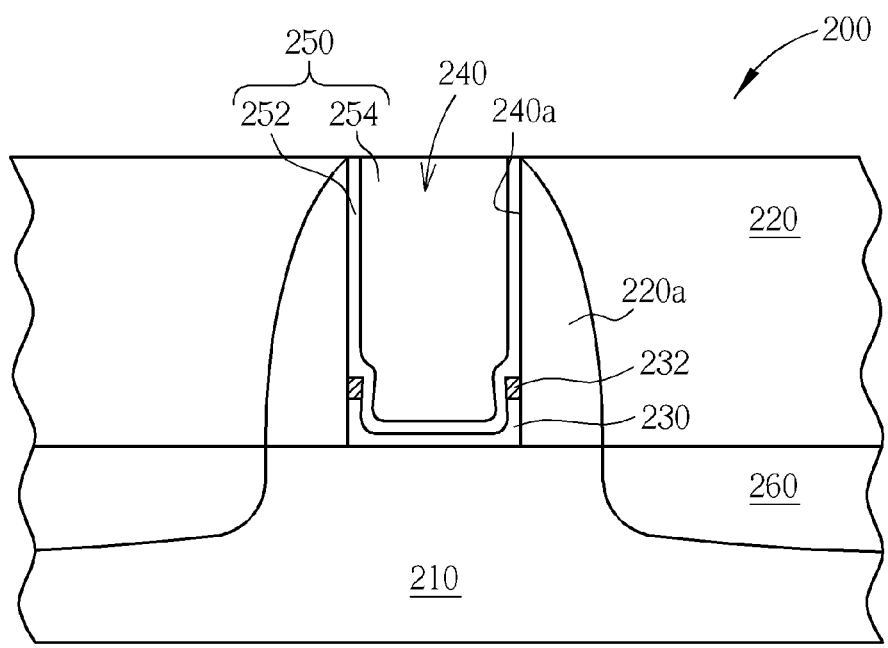

As shown in FIG. 3D, the remaining filling material 270 is removed after a portion of the metal layer 232 is removed, thereby forming the high-k dielectric layer having a U-shape profile 230 exposing the upper portion 240a of the sidewalls of the trench 240. In this time, there is still a portion of the metal layer 232 remaining. Then, a work function metal layer, a barrier layer, a filling metal layer etc. may be sequentially filled into the trench 240 to form a transistor structure (as shown in FIG. 3D'). In this way, the top of the sidewalls of the trench 240 does not contain the high-k dielectric layer having a U-shape profile 230, thereby avoiding the filling difficulty of the work function metal layer, the barrier layer, the filling metal layer, etc. Besides, the semiconductor device 200 of the present invention has a smaller fringe capacitance than the semiconductor device 100 of the prior art.

The sequentially filled work function metal layer (not shown) (also has a U-shape profile structure) is selectively etched back after the high-k dielectric layer having a U-shape profile 230 exposing the upper portion 240 of the sidewalls of the trench 240 is formed, to remove a portion of the two ends of the U-shape profile of the work function metal layer for exposing the upper portion 240a of the sidewalls of the trench 240 again. In a preferred embodiment, the two ends of the U-shaped cross-sectional profile of the work function metal layer 252 are trimmed with the two ends of the U-shaped cross-sectional profile 230a. As a result, the filling metal layer formed after the work function metal layer is more easily filled into the trench 240, thereby the size of the semiconductor device 200 can be shrank.

Figure 3E:
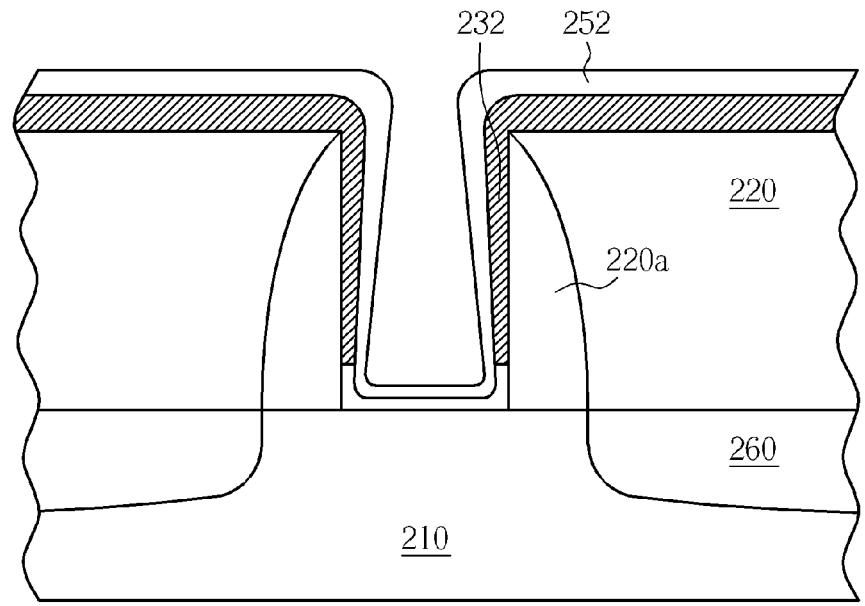
FIG. 3E schematically depicts a cross-sectional view of a fabricating method of the semiconductor device of FIG. 2.
Figure 3F:
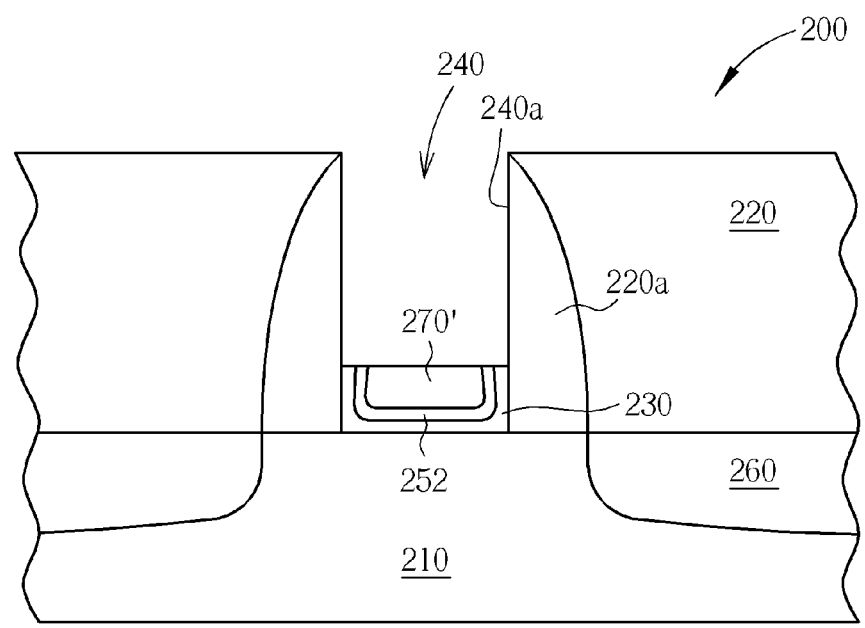
FIG. 3F schematically depicts a cross-sectional view of a fabricating method of the semiconductor device of FIG. 2.

Otherwise, after finishing the step of FIG. 3C (reducing the exposed two ends of the U-shaped cross-sectional profile 230a to transform to a metal layer 232), the steps of FIG. 3E-3F can be operated instead of FIG. 3D. As shown in FIG. 3E, after reducing the exposed two ends of the U-shaped cross-sectional profile 230a to transform to a metal layer 232, the filling material 270 is removed. Then, a work function metal layer 252 is deposited. As shown in FIG. 3F, a filling material 270' is filled and etched to expose the two ends of the U-shaped cross-sectional profile of the work function metal layer 252, and then the exposed two ends of the U-shaped cross-sectional profile of the work function metal layer 252 and the metal layer 232 are sequentially removed by using the filling material 270' as a mask. Finally, the remaining filling material 270' is removed. In a preferred embodiment, after the work function metal layer 252 is deposited, a barrier layer (not shown) is selectively formed to avoid the work function metal layer 252 from being damaged as the filling material 270' is removed.

The spirit of the present invention is to transform the two ends of the U-shaped cross-sectional profile 230a to a metal layer 232 by the filling material paired with the reduction process, and then removing at least a portion of the metal layer 232 to expose the upper potion 240a of the sidewalls of the trench 240. Therefore, all of methods for achieving the purpose can be seen as in the scope of the present invention. There is another fabricating method disclosed below.

Figure 4A:
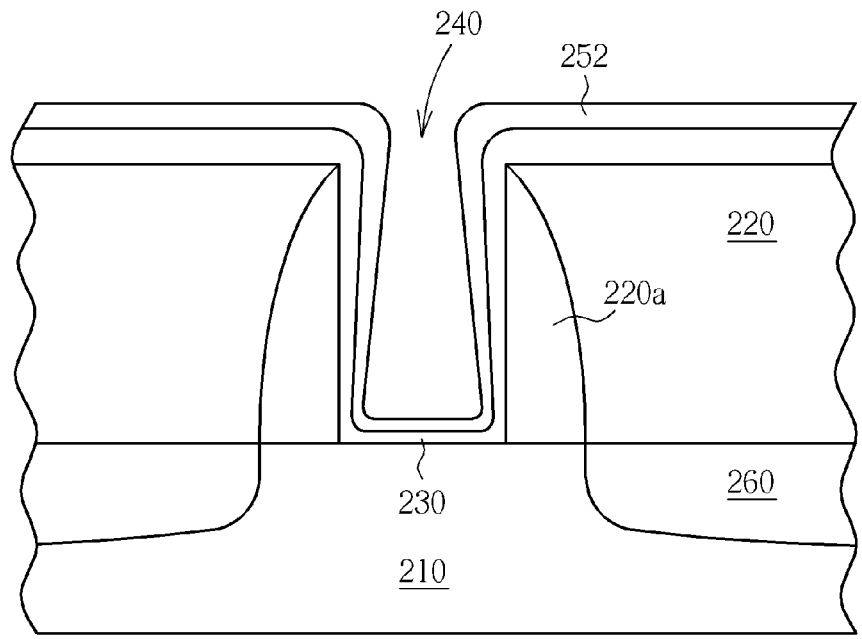
FIG. 4A schematically depicts a cross-sectional view of another fabricating method of the semiconductor device of FIG. 2.
Figure 4B:
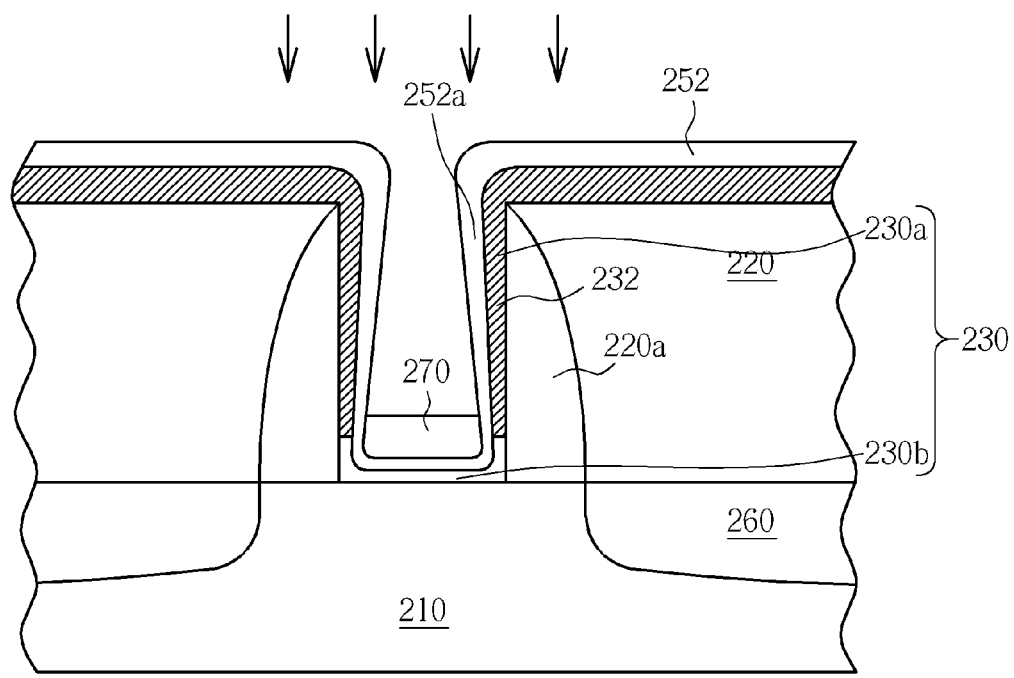
FIG. 4B schematically depicts a cross-sectional view of another fabricating method of the semiconductor device of FIG. 2.
Figure 4C:
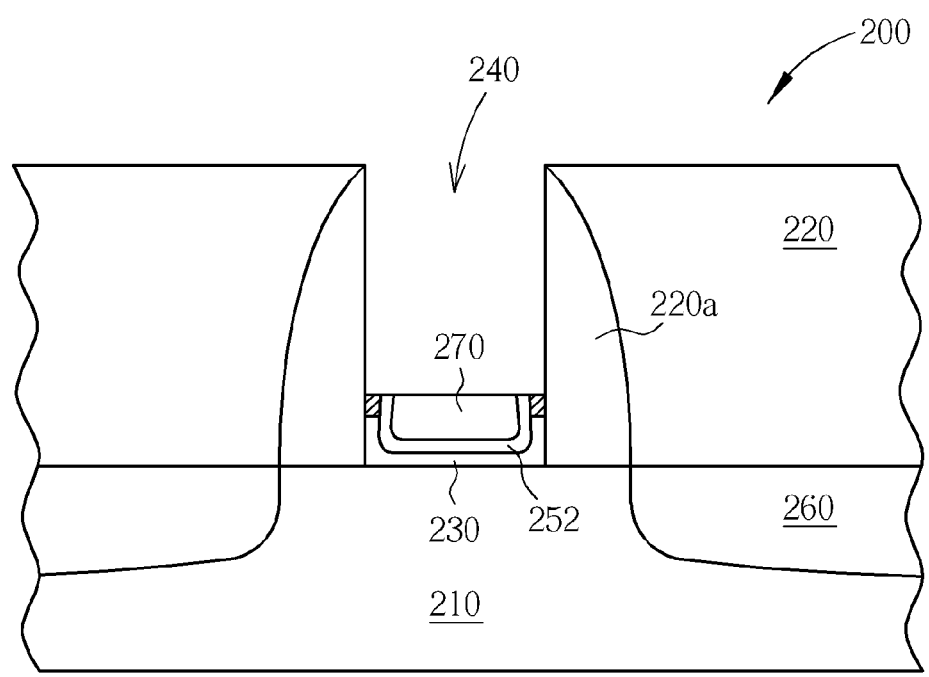
FIG. 4C schematically depicts a cross-sectional view of another fabricating method of the semiconductor device of FIG. 2.

FIG. 4A-4C schematically depict a cross-sectional view of another fabricating method of the semiconductor device of FIG. 2. As shown in FIG. 4A, a substrate 210 is provided, an inter layer dielectric layer 220, which may include a spacer 220a, is formed on the substrate 210. A trench 240 is formed in the inter layer dielectric layer 220, wherein the fabricating methods of these are common with FIG. 3A and are known in the prior art and so are not described herein. A high-k dielectric layer having a U-shape profile 230 is formed in the trench 240. A work function metal layer having a U-shape profile 252 is formed on the high-k dielectric layer having a U-shape profile 230. In a preferred embodiment, a barrier layer (not shown) is selectively formed between the high-k dielectric layer having a U-shape profile 230 and the work function metal layer having a U-shape profile 252 to prevent the two material layers from polluting each other. Furthermore, a barrier layer (not shown) may be further formed on the work function metal layer having a U-shape profile 252 to prevent the work function metal layer having a U-shape profile 252 from being damaged in sequential processes. Besides, an interface layer (not shown) may be included between the substrate 210 and the high-k dielectric layer having a U-shape profile 230 for being a buffer layer of the substrate 210 and the high-k dielectric layer having a U-shape profile 230.

As shown in FIG. 4B, the filling material 270 is filled, and then the filling material 270 is etched back to expose the two ends of the U-shaped cross-sectional profile 252a of the work function metal layer having a U-shape profile 252 and the two ends of the U-shaped cross-sectional profile 230a of the high-k dielectric layer having a U-shape profile 230 located beneath it. The U-shaped cross-sectional profile 230a is reduced to transform it to a metal layer 232, wherein the reduction process may include a hydrogen containing reduction process or a hydrogen plasma containing reduction process. The U-shaped cross-sectional profile 230a can be directly reduced without removing the work function metal layer 252 because the thickness of the work function metal layer having a U-shape profile 252 is thin enough, but the reduction process can not reduce the bottom 230b of the high-k dielectric layer having a U-shape profile because the reduction elements can not penetrate the filling material 270.

AS shown in FIG. 4C, at least a portion of the two ends of the U-shaped cross-sectional profile 252a and the metal layer 232 are removed. Then, the filling material 270 is removed. Moreover, a barrier layer (not shown) and a filling metal layer may be formed to fill the trench 240, thereby the semiconductor device 200 of FIG. 2 is finished.

Furthermore, the fabricating methods of the semiconductor device depicted in FIG. 3A-3F and FIG. 4A-4C can include a gate-last process, more specifically to a gate-last for high-K last process. However, the fabricating methods paired with gate last process are cases of the present invention, but it is not limited thereto. The method of reducing and removing the sidewalls of the material layers by using the filling material in the present invention is also suited for other semiconductor processes.

Otherwise, the diagrams depicted in FIG. 3A-3F and FIG. 4A-4C are embodiments of forming a single MOS transistor, but the fabricating method of the semiconductor device of the present invention can be also used in forming CMOS transistors. As the fabricating method of the semiconductor device is applied to a CMOS transistor, except for respectively reducing the two ends of the U-shape profile of the high-k dielectric layer having a U-shape profile of a PMOS transistor and an NOMS transistor located on the two sides of the COMS transistor, and respectively removing the two ends of the U-shape profile of high-k dielectric layer having a U-shape profile and the work function metal layer, the two ends of a U-shape profile of high-k dielectric layer having a U-shape profile and the work function metal layer of the PMOS transistor and the NMOS transistor located on the two sides of the COMS transistor can also be reduced and removed at the same time.

According to the above, the present invention provides a semiconductor device and fabrication method thereof, which includes: reducing the two ends of the U-shape profile of the high-k dielectric layer having a U-shape profile to transform it to a metal layer by using a photoresist filling material, a bottom anti-reflection coating (BARC) or a light absorbing oxide (DUO) as a mask after the high-k dielectric layer having a U-shape profile is formed or the work function metal layer is formed. Then, at least a portion of the metal layer is removed by itself, or at least a portion of the metal layer and a portion of the two ends of the U-shape profile of the work function metal layer are removed in the same step. In this way, the filling difficulty of filling the sequential material layers such as the barrier layer, the filling metal layer etc. into the trench would not happen because there are not too many material layers having a U-shape profile being deposited on the top of the trench. Besides, the semiconductor device fabricated by the methods of the present invention has a lower fringe capacitance because the methods of the present invention removes at least a portion of the two ends of a U-shape profile of the high-k dielectric layer having a U-shape profile.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor device, comprising:
    forming an inter layer dielectric layer on a substrate;
    forming a trench in the inter layer dielectric layer;
    forming a high-k dielectric layer having a U-shape profile in the trench;
    transforming two ends of the U-shape profile to a metal layer, wherein the transforming step is a reduction;
    after transforming the two ends of the U-shape profile to the metal layer, forming a work function metal layer on the high-k dielectric layer and the metal layer; and
    removing a portion of the metal layer to expose an upper portion of sidewalls of the trench.

2. The fabricating method of the semiconductor device according to claim 1, wherein the work function metal layer covers the upper portion of the sidewalls of the trench.

3. The fabricating method of the semiconductor device according to claim 2, further comprising:
    forming a barrier layer and a filling metal layer on the work function metal layer.

4. The fabricating method of the semiconductor device according to claim 1, wherein removing a portion of the metal layer comprises the steps of:
    filling a filling material in the trench;
    etching back the filling material;
    removing the portion of the metal layer; and
    removing the filling material.

5. The fabricating method of the semiconductor device according to claim 4, wherein the filling material comprises a photoresist material, a bottom anti-reflection coating (BARC) or a light absorbing Si-content polymer (DUO).

* * * * *